United States Patent

Lehmann et al.

(10) Patent No.: US 6,601,205 B1
(45) Date of Patent: Jul. 29, 2003

(54) METHOD TO DESCRAMBLE THE DATA MAPPING IN MEMORY CIRCUITS

(75) Inventors: Gunther Lehmann, Poughkeepsie, NY (US); Gerd Frankowsky, Höhenkirchen-Siegertsbrunn (DE); Louis Hsu, Fishkill, NY (US); Armin Reith, Munich (DE)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 381 days.

(21) Appl. No.: 09/675,953

(22) Filed: Sep. 29, 2000

(51) Int. Cl.[7] .................... G01R 31/28; G06F 11/00; G11C 29/00; G09G 5/22

(52) U.S. Cl. ............ 714/741; 714/728; 714/720; 345/551

(58) Field of Search ............... 714/738, 728, 714/720, 741; 345/551; 703/14

(56) References Cited

U.S. PATENT DOCUMENTS

| | | | | |
|---|---|---|---|---|
| 5,325,309 A | * | 6/1994 | Halaviati et al. | 703/15 |
| 5,371,851 A | * | 12/1994 | Pieper et al. | 345/501 |
| 5,506,959 A | * | 4/1996 | Cockburn | 714/42 |
| 5,720,031 A | * | 2/1998 | Lindsay | 714/42 |
| 6,081,463 A | * | 6/2000 | Shaffer et al. | 365/200 |
| 6,185,707 B1 | * | 2/2001 | Smith et al. | 714/724 |
| 6,205,407 B1 | * | 3/2001 | Testa et al. | 702/119 |
| 6,363,500 B1 | * | 3/2002 | Hamada | 714/25 |
| 6,442,724 B1 | * | 8/2002 | Augarten | 714/738 |
| 6,449,744 B1 | * | 9/2002 | Hansen | 714/738 |
| 6,499,120 B1 | * | 12/2002 | Sommer | 714/723 |

* cited by examiner

*Primary Examiner*—Albert Decady
*Assistant Examiner*—Joseph D. Torres
(74) *Attorney, Agent, or Firm*—Stanton Braden

(57) ABSTRACT

An automatic method for the generation of a logical hardware test pattern in memory circuits is based on a given physical pattern. The method includes backwards transformation from a given set of logical data patterns. Since the method is automatic, no knowledge of data scrambling inside the memory circuit is required.

12 Claims, 3 Drawing Sheets

METHOD TO DESCRAMBLE THE DATA MAPPING IN MEMORY CIRCUITS

BACKGROUND OF THE INVENTION

1. Field of the Invention

The present invention generally relates to methods of addressing in memory circuits and, more particularly, to a method which simplifies the testing of memory circuits by overcoming the mapping problems between physical and logical data patters (i.e., data scrambling).

2. Background Description

In a memory circuit (e.g., a Static Random Access Memory (SRAM), Dynamic Random Access Memory (DRAM), and the like), data is normally stored in a matrix of memory elements. The data values of the memory elements can be accessed (read operation) or modified (write operation) exclusively by using the interface of the memory circuit. During a read command, an address is supplied to this interface. Then, this address is processed by the memory circuit and the data located at this address is delivered to the data output. In contrast, a write command stores externally provided data at the address supplied in conjunction with the data.

Therefore, a memory circuit exhibits two types of memory addressing. One address describes the physical location of a storage element (referred to as the "physical address"). The other address is the address that has to be provided to the interface of the memory circuit in order to access a specific storage element (referred to as the "logical address"). In prior memory generations the relation between the physical and the logical addresses was simple, because the two portions of the logical address (typically called row and column) had a transparent relation to the x and y-coordinates of the storage elements (i.e., the physical address).

However, modem architectures of memory circuits increasingly obstruct the extraction of a transparent mapping scheme between the logical and the physical addresses. The non-trivial mappings are summarized by the term "data scrambling". Generally, data scrambling can be caused by several factors, including:

bit line twisting, word line addressing and segmentation, layout mirroring, multiplexing and de-multiplexing of data packages in the burst modes, and wrap type dependency (interleaved versus sequential).

The combination of these data scramblings makes it nearly impossible to derive a logical address for a given physical address. However, this is a prerequisite for hardware testing, since the storage elements of a memory matrix are solely accessible through the interface of the memory circuit. In particular, several characteristic physical data patterns, like stripes, checker board, blankets, etc., are executed for a memory matrix in order to identify problems caused by coupling and substrate noise. Furthermore, hardware testing must be able to extract the physical location of failures when the data at the logical interface is incorrect.

Taking into account the size of current memory circuits, it is obvious that test pattern generation and analysis has to be performed automatically. However, currently used pattern generation techniques (based on procedural programming) are inefficient because the development of the underlying generation algorithm is obstructed by the data scrambling.

SUMMARY OF THE INVENTION

It is therefore an object of the present invention to provide an automatic pattern generation and analysis method for performing hardware testing of memory circuits.

According to the invention, there is provided an automatic generation of a logical hardware test pattern based on a given physical pattern. The method includes the backwards transformation from a given set of logical data pattern. Since the method is automatic, no knowledge of the data scrambling inside the memory circuit is required.

The practice of the invention requires the following elements:

A pattern viewer and generator which represents a graphical user interface (GUI). This interface enables a graphical definition of the values stored in the memory elements. Furthermore, it provides a library with predefined standard pattern, like checker boards. Besides definition of pattern, this module also allows viewing the pattern stored in the memory circuit.

A layout of the memory matrix (or array). This portion is derived from the memory design. Basically, it provides the geometrical location (i.e., the x and y-coordinates) of each storage element.

A flattened array netlist (typically generated by a layout versus schematic tool) delivers a link between the hierarchical name of each storage element and its geometrical location.

A hierarchical representation of the memory circuit (netlist) which can be executed by a logic simulator.

A logic simulator allows modeling the behavior of the memory circuit by executing read and write commands on the netlist. Additionally, it provides a functionality to set initial conditions on circuit nodes (like the voltages of storage elements) before a simulation is started. Likewise, a functionality is supported which reads the final conditions of circuit nodes at the end of the simulation.

A pattern server (and/or a tester RAM) acts as an intermediate storage between the hardware tester and the logic simulator. Data is exchanged in pairs of address and data, simply describing the data value(s) stored at a specific logical address.

A hardware tester generates and measures electrical signals at the pins of the memory device.

A bit map analyzer can compare physical data patterns. Mismatches between an input pattern and the derived pattern can be analyzed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
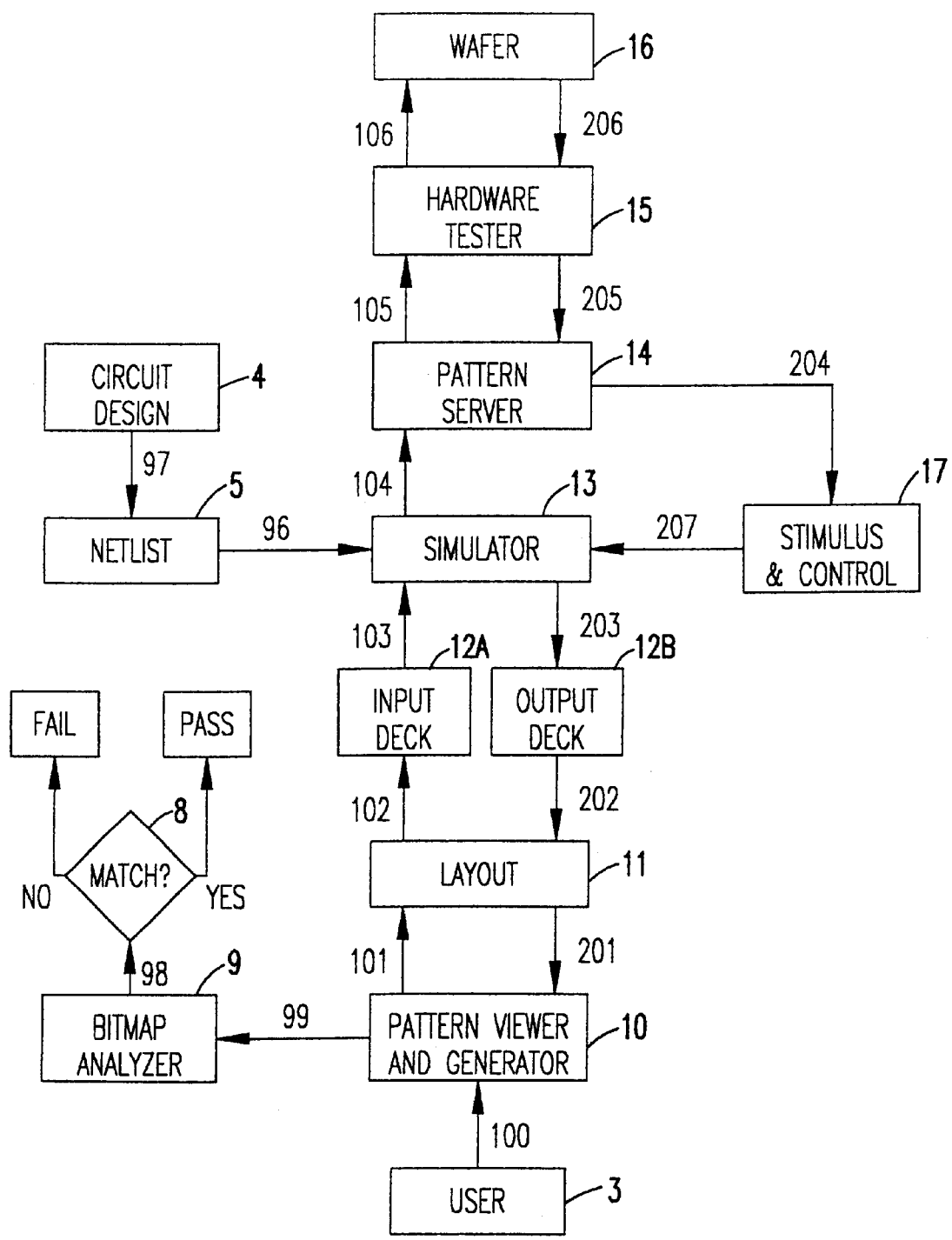
FIG. 1 is a block diagram showing the data flow of generating a physical array data pattern and converting it to the logical data pattern for testing and analysis of the MOS memory array according to the invention.

Procedures for Converting Array Physical Data Pattern into a Logical Data Pattern Referring now to the drawings, and more particularly to FIG. 1, there is shown in block diagram form the data flow of the pattern generation and pattern analysis of the invention. A pattern viewer and generator 10 provides a graphical user interface (GUI), which allows inputting data patterns and viewing stored data patterns by the user(s) 3. This interface facilitates both the user(s) input of data and viewing of data via a graphical definition of the values stored in a memory array. Furthermore, it stores a library with predefined standard patterns, like checker board pattern, a stripe pattern, a random pattern, a blanket pattern, and the like. The data patterns can be in a table format with identical rows and columns as those of the memory array to be tested.

The layout 11 of the memory array is done by human operator or software in step 100 to create a physical design of the memory array using any conventional layout tool. The generated memory array physical layout generally contains many levels and shapes to be used to generate masks for memory array fabrication.

Each cell in the memory array physical layout 11 is mapped with predefined data from a table stored in the pattern generator module 10. The mapping technique is done via software which automatically writes the data "1" or "0" into each cell of the array via step 101.

Figure 2:
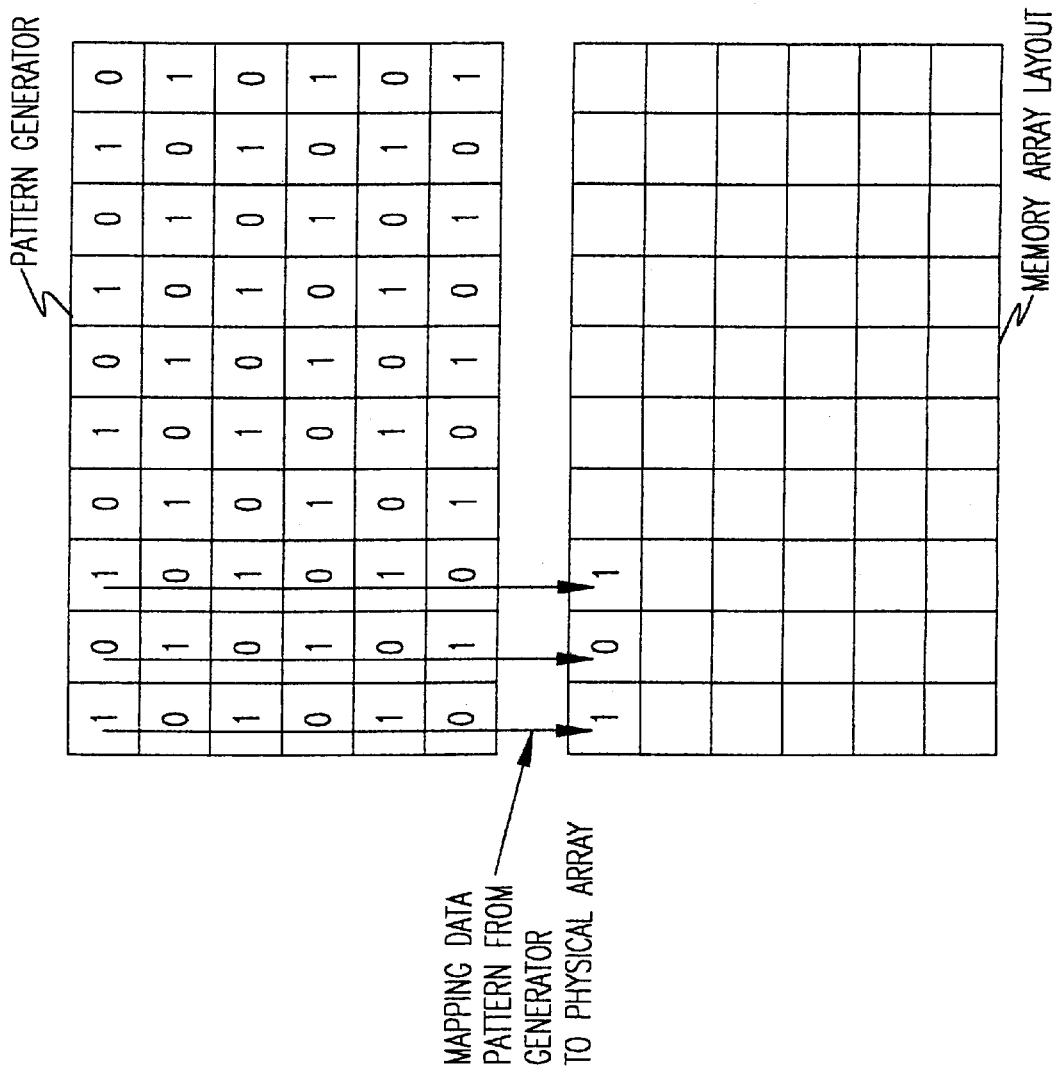
FIG. 2 is a diagram illustrating the method of inputting a known physical data pattern into the layout of the array via a data mapping technique according to the invention.

The detail of data mapping from the pattern generator 10 to the physical layout 11 is illustrated in FIG. 2. For example, a checker board pattern from a library is loaded to the pattern generator. A software program is used to carry out the one-to-one data mapping from pattern viewer to the physical layout. Once is done, the physical layout module will have all the cells stored with the checker board data pattern.

The data pattern stored in the layout 11 are then streamed in step 102 to an input deck 12A to define the initial conditions of each cell in the array. Each initial condition carries a full cell address path indicating the logical location of that cell and the value of the initial condition. The data streaming process 102 is done by using a LVS tool, or Layout Versus Schematic tool, known in the art.

The existing LVS software, can perform cross-reference checking of a circuit layout against its schematic. The purpose of the LVS checking is to verify the match of layout against its schematic. This tool can be modified to transfer the data patterns that are stored in the array of the layout into an input deck and listed as the initial condition for the cells. For example, the data that is stored in the array of the physical layout can be translated into a flattened format with all the hierarchical paths of each cell indicating the cell location in terms of which array, which sub-array, which row and column address. After mapping is done by a the software, all the initial conditions for all cell with a known data pattern are streamed into an input deck 12A. To be more specific, the all physical data pattern are now recorded into the initial conditions of the deck and ready for simulation. These initial conditions are input to the simulator 13 in step 103.

In order to carry out a simulation, a netlist 5 is generated in step 97 from the memory circuit schematic 4 by using any existing software for the purpose. For example, a Cadence tool can be used to create the netlist from a schematic. An example of an input deck and a netlist generated by the Cadence tool for a simple circuit is shown below.

Input Deck

Stimulus:

| | | | |
|---|---|---|---|
| vvint | vint! | gnd! | DC vint |
| Vclock | dock | gnd! | Pulse 0 vint 0n 1n 1n 5n 10n |
| VRAS | RAS | gnd! | Pwl 0 vint 10n vint 11n 0V 20n 0V 21n vint |
| VCAS | CAS | gnd! | Pwl 0 vint 30n vint 31n 0V 40n 0V 41n vint |
| VWE | WE | gnd! | Pwl 0 vint 30n vint 31n 0V 40n 0V 41n vint |

..........................

Initial Condition:

.ic v(xBank<1>.xBlock<1>.xCell<0000>.vCell)=0
.ic v(xBank<1>.xBlock<1>.xCell<0001>.vCell)=vint
.ic v(xBank<1>.xBlock<1>.xCell<0002>.vCell)=0
.ic v(xBank<1>.xBlock<1>.xCell<0003>.vCell)=vint

..........................

Run Control Parameters
.TRAN 0.1n 1u

Netlist

\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*
\*GLOBAL Net Declarations
\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*
.global GND!
\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*
\*Main Circuit Netlist:
\*
\*Block: LP_SRAM - schematic
\*Library: hsu_sonic
\*Last Time Saved: Sep 12 10:53:53 2000
\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*
mT6    Vsupply    Sw    net025 GND! HVTNFET w=' 1.000u' l=' 120.000n'
res_0          net025 net027 r-'.1'
vfanout_0    net027 net037 DC=0                    \*Fanout -continued

```
fanout_0      net027 gnd! vfanout_0'          25.000K-1' *Fanout
cap_0 Vsupply        GND! c=' 1.000p'
mT3           high   low  net037 net037       PFET w=' 170.000n' l=' 140.000n'
mT2           low    high net037 net037       PFET w=' 170.000n' l=' 140.000n'
mT1           high   low  GND!   GND!         NFET w=' 230.000n' l=' 120.000n'
mT0           low    high GND!   GND!         NFET w=' 230.000n' l=' 120.000n'
.probe tran v( SW)
.probe tran v( Vsupply)
.probe tran v( net037)
.probe tran v( net025)
.probe tran v( high)
.probe tran v( net027)
.probe tran v( low)
```

Therefore, the netlist is the circuit schematic that is compiled in a text format known by the simulator 13 and supplied to the simulator 13 in step 96.

However, in order to read the data stored inside the memory array, the memory array must be pre-loaded with a known data pattern. The initial conditions stored in the input will facilitate the simulator 13 to load the data into array. This is done by supplying initial conditions to pre-load the array. Once the array is pre-loaded with the known data pattern, an array reading simulation can be carried out by the simulator 13. Any existing logic simulator 13, for example, Starsim, Powermill, VHDL, or Verilog, can be used for array read simulation.

Figure 3:
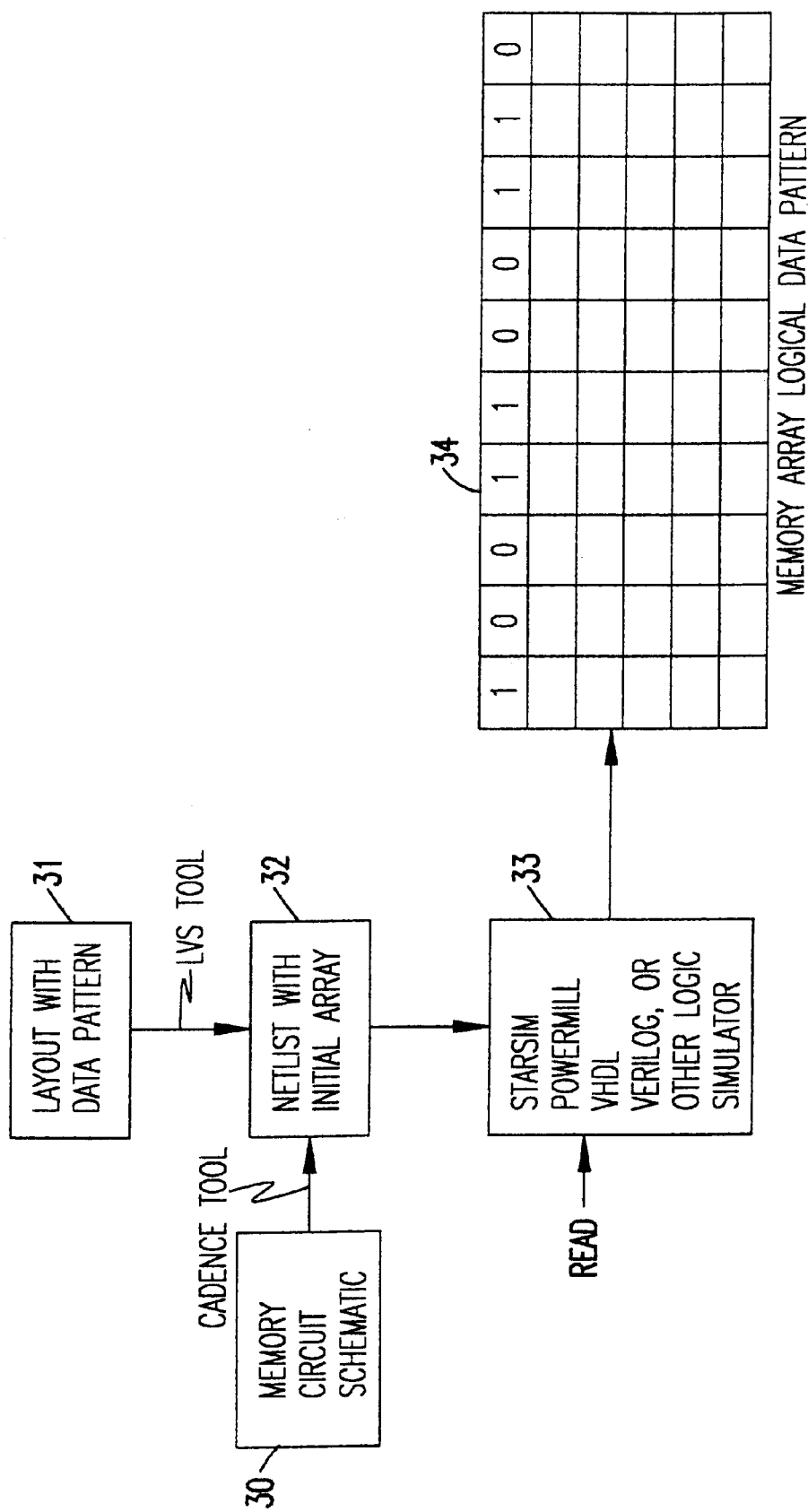
FIG. 3 is a flowchart showing the logic of creating a logical data pattern from a known physical data pattern.

In summary, as illustrated in FIG. 3, the modified LVS tool extracts the initial data values from array layout 31. Then, by merging the netlist and the initial conditions 32, a logic simulator 33 tool can perform a full array read simulation of memory array 34. Each read cell data with logical address from the array is stored in the pattern server 14.

The pattern server 14 acts as an intermediate storage between the hardware tester 15 and the simulator 13. Data stored in the pattern server 14 have both fields of address and data value, simply describing the data value(s) stored at a specific logical address. This finishes our first embodiment, which is to convert a known physical array data pattern into the corresponding logical data pattern. The logical data pattern can be in a bit-map format, or table format.

Procedures of Testing Memory Array Using a Known Physical Data Pattern

The information stored in the pattern server 14 instructs the tester, in step 106, to program the DRAM array on wafer hardware 16 (e.g., memory chips on a wafer) with the information, including logical address and write data values to each cell. After the array is programmed, and after a specific period of time, the data are read out in step 206 by the tester. The result from hardware tester 15 generates read addresses and measures electrical signals of the cells located at those addresses which are then stored in the pattern server 14 in a logical bit map format in step 205. This logical bit map from the tester can be compared with the logical bit map generated in step 105 used to program the data into hardware 16 to detect a failure. However, this will not give information of physical location failure bit(s). Therefore, one must continue to convert this logical bit map measured from hardware back to physical bit map, in order that the failure location in the array may be determined.

The logical bit map is output from the hardware tester 15 in step 205 to the pattern server 14 and then converted in step 204 into stimulus 17 format for a write simulation which is output to the simulator 13 in step 207. The same simulator 13 and netlist 5 can be used to write the logical data pattern into the memory array, and thus generate an output deck 12B in step 203. This data stored in the output deck now has physical addresses similar to those in the input deck 12A described earlier. The data stored in the output deck 12B is then back-streamed in step 202 to the layout 11 using the same modified LVS tool, but in the reverse manner.

A simple software program in step 201, similar to the one mentioned earlier in step 101, is used to map to a physical bitmap or table format in the pattern viewer and generator 10. The read data from the hardware is now visible to the user 3.

The bit map analyzer 9 interfaces with the pattern viewer and generator 10 in step 99 and can compare in step 98 using matching function 8 physical data patterns between the original input pattern and the pattern read from the hardware. Mismatches between an input pattern and the tested pattern can be displayed and analyzed.

Based on this structure, the characteristics of a fabricated memory circuit can be easily investigated despite any data scrambling. First, the user of the method selects, using the GUI of the pattern view and generator 10, a physical data pattern that should be applied to the memory chip. This physical map of data is then translated into initial conditions to the logic simulator 13 for the corresponding storage elements inside the netlist by using the circuit layout module 11 and the flattened netlist 5. After assigning the initial conditions, a simulation run is performed which reads out the memory by applying all possible addresses to the memory model. As a result, a set of (address, data) pairs is obtained representing the logical data pattern corresponding to the initial physical data pattern. The content of this look-up table is then written to the actual memory hardware by using the hardware tester 15. After writing the memory hardware, and after a predetermined wait time, the tester reads out the memory by applying all possible addresses. These results are stored as (address, data) pairs inside the pattern server 14. The wait time normally is less than the retention time of the memory cells. During this wait time, some cells could fail due to certain types of defects. If the wait time is more than the designed cell retention time, the majority of the cells will fail. The wait time may be varied from 0 to 100 ms. This test is normally used to determine the cell retention time.

At this point, it is already possible to identify the logical addresses of failures by simply comparing the (address, data) pairs of the write and read operation. However, in order to spot the physical location of failures, the data scrambling has to be reversed again. Therefore, the (address, data) pairs derived during the read operation from the actual hardware are written to the array using a simulation model.

At the end of the simulation, the content of all storage elements are extracted directly from the hierarchical cross section netlist 5. These values are then mapped to their physical location by using the flattened netlist and the memory layout module 11 again. Finally, the resulting physical data pattern is displayed by the pattern viewer and generator 10. Additionally, the bit map analyzer 9 might be used to compare the initial physical pattern with the derived pattern, thus indicating areas with bit failures.

The method of the invention is useful when a memory circuit exhibits a non-trivial data scrambling. In particular, it is helpful for circuit testing when hardware failures have to be located in the layout. Since the method circumvents all manual analysis, it will significantly speed up the development of hardware test pattern. It can be used in the test environment as a black box tool where the only interface to the user is a graphical pattern generator and viewer. Inside this interface, the test engineer can graphically set and analyze test pattern independent of any data scrambling. From the designer's perspective, this method supports the verification of data scrambling, because it helps to relate physical to logical data patterns.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An automatic method for the generation of a logical hardware test pattern in memory array circuits comprising the steps of:
    generating a graphical user interface (GUI) that enables a graphical definition of data values stored in memory elements of a memory circuit and allows viewing a pattern stored in the memory circuit;
    providing a geometrical location of each storage element in the memory circuit;
    providing a link between a hierarchical name of each storage element and its geometrical location;
    providing a hierarchical representation of the memory array circuit in the form of a netlist which can be executed by a logic simulator;
    modeling in a logic simulator a behavior of the memory circuit by executing read and write commands on the netlist;
    providing an intermediate storage between a hardware tester and the logic simulator, wherein data is exchanged in pairs of address and data, simply describing the data value(s) stored at a specific logical address; and
    generating and measuring electrical signals at pins of the memory circuit by the hardware tester.

2. The automatic method for the generation of a logical hardware test pattern in memory array circuits of claim 1, wherein the step of generating a graphical user interface allows manual input of a data pattern.

3. The automatic method for the generation of a logical hardware test pattern in memory array circuits of claim 1, wherein the step of generating a graphical user interface allows selection of a pre-defined data pattern.

4. The automatic method for the generation of a logic hardware test pattern in memory array circuit of claim 3, wherein the pre-defined data pattern is selected from the group consisting of a checker board pattern, a stripe pattern, a random pattern, and a blanket pattern.

5. The automatic method for the generation of a logical hardware test pattern in memory array circuits of claim 1, wherein the step of providing a geometrical location of each storage element in the memory circuit is performed by a mapping technique which automatically writes data "1" or "0" into each cell of the array.

6. The automatic method for the generation of a logical hardware test pattern in memory circuits of claim 1, wherein the step of providing a link between the hierarchical name of each storage element and its geometrical location is performed using a layout versus schematic (LVS) tool.

7. The automatic method for the generation of a logical hardware test pattern in memory circuits of claim 1, wherein the step of providing a hierarchical representation of the memory array circuit in the form of a netlist is performed by compiling a circuit schematic in a text format known by the simulator.

8. The automatic method for the generation of a logical hardware test pattern in memory circuits of claim 1, further comprising the steps of:
    outputting a logical bitmap generated from measured electrical signals;
    converting the logical bitmap into a stimulus format for the logic simulator and generating physical addresses corresponding to the logical bitmap;
    mapping the physical bitmap for display in the graphical user interface, allowing a user to view and analyze mismatches between an input physical pattern and the tested physical pattern.

9. The automatic method for the generation of a logical hardware test pattern in memory circuits of claim 8, further comprising the step of automatically analyzing differences between the input physical pattern and the tested physical pattern.

10. A system for automatic pattern generation and analysis used in testing memory array circuits comprising:
    a pattern viewer and generator which represents a graphical user interface (GUI) that enables a graphical definition of data values stored in memory elements of memory array circuits and allows viewing a pattern stored in memory array circuits;
    a layout of a memory array derived from a design of a memory array circuit providing a geometrical location of each storage element;
    a flattened array netlist generated by a layout versus schematic (LVS) tool providing a link between a hierarchical name of each storage element and its geometrical location;
    a hierarchical representation of a memory array circuit in the form of a netlist which can be executed by a logic simulator;
    a logic simulator allows modeling the behavior of the memory array circuit by executing read and write commands on the netlist and setting initial conditions on circuit nodes and reading final conditions of circuit nodes at an end of a simulation;
    a pattern server serving as an intermediate storage between a hardware tester and the logic simulator, data being exchanged in pairs of address and data, simply describing the data value(s) stored at a specific logical address;
    a hardware tester generating and measuring electrical signals at pins of a memory array circuit after a predetermined period of time following when known data are programmed in the memory array; and a bit map analyzer comparing physical data patterns to analyze mismatches between an input pattern and a derived pattern.

11. The system for automatic pattern generation and analysis used in testing memory array circuits of claim 10, wherein said pre-determined period of time is less than a designed cell retention time.

12. The system for automatic pattern generation and analysis used in testing memory array circuits of claim 10, wherein said pre-determined period of time is varied in the range of 0 to 100 ms in order to determine cell retention time.

\* \* \* \* \*